United States Patent [19]

Acarlar et al.

[11] Patent Number: 5,113,466

[45] Date of Patent: May 12, 1992

[54] MOLDED OPTICAL PACKAGING ARRANGEMENT

[75] Inventors: Muvaffak S. Acarlar, Allentown, Pa.; Louis T. Manzione, Summit, N.J.; Steven D. Robinson, Lower Macungie Township, Lehigh County; Dennis Stefanik, Weisenberg Township, Lehigh County, both of Pa.

[73] Assignee: AT&T Bell Laboratories, Murray Hill, N.J.

[21] Appl. No.: 691,649

[22] Filed: Apr. 25, 1991

[51] Int. Cl.$^5$ ............................ G02B 6/00; G02B 6/36
[52] U.S. Cl. ........................................................ 385/88
[58] Field of Search ..... 350/96.10, 96.15, 96.20–96.21

[56] References Cited

U.S. PATENT DOCUMENTS

| | | | |
|---|---|---|---|
| 4,307,934 | 12/1981 | Palmer | 350/96.20 |
| 4,410,469 | 10/1983 | Katagiri et al. | 350/96.20 |
| 4,633,582 | 1/1987 | Ching et al. | 350/827 |
| 4,752,109 | 6/1988 | Gordon et al. | 350/96.20 |
| 4,798,440 | 1/1989 | Hoffer et al. | 350/96.20 |
| 4,911,519 | 3/1990 | Burton et al. | 350/96.20 |
| 4,913,511 | 4/1990 | Tabalba et al. | 350/96.20 |
| 4,920,262 | 4/1990 | Aiki et al. | 350/96.20 |

*Primary Examiner*—Akm E. Ullah
*Attorney, Agent, or Firm*—Wendy W. Koba

[57] ABSTRACT

An optical communication arrangement is disclosed which utilizes a combination of leadframe and package molding technology to reduce the complexity of the arrangement. In general, a leadframe is utilized for the placement and connection of the required electronic circuitry. A first molding operation is then performed to encapsulate the electronics. If necessary, a metallic plate may then be attached to the housed electronics to provide EMI shielding. An optical device is then coupled to the leadframe, where a separate subassembly may be used to house the optical device. The encapsulated electronics and optics are then simultaneously covered during a second molding operation to form the final package. In one embodiment, an optical subassembly incorporating a connector receptacle may be utilized, where the second molding operation is performed such that the connector receptacle remains exposed. Alternatively, the molded outer package may be configured to include the connector receptacle.

26 Claims, 6 Drawing Sheets

MOLDED OPTICAL PACKAGING ARRANGEMENT

BACKGROUND OF THE INVENTION

1. Technical Field

The present invention relates to optical packaging technology and, more particularly, to a molded optical packaging arrangement.

2. Description of the Prior Art

There exist many different arrangements for packaging optical communication arrangements. For example, the optical device (e.g., laser, LED or photodiode) may be attached to a mount which is subsequently aligned with and attached to a base member, the base member including lensing elements to facilitate coupling of an optical fiber to the optical device. In most cases, the base member will include a spherical lensing element to maximize the optical coupling. The arrangement of the mounted optical device, base member and lens is often referred to in the art as an optical subassembly, or OSA. The electronics required for operating the optical device (a driver circuit for a transmitter, or an amplification and decision circuit for a receiver, for example) may then be separately assembled (on a printed wiring board, for example) and connected to the optical subassembly by conventional electrical leads. Alternatively, the electronics may be fully enclosed in a separate housing, with only the leads exposed for connection to the optical subassembly. An advantage of using separate housings for the electronics and optics relates to the ability to interchange the components as required for different applications. For example, a data link application may operate with TTL electronic signals, and another application (with the same optics) may utilize ECL electronic signals. Additionally, if either the electrical or optical portion of an arrangement were to experience a failure, the working portion could be disconnected and re-used with another arrangement. A major disadvantage of separate packaging is the overall size of the resultant arrangement. With two separate packages, or an optical package mounted on a printed wiring board, the arrangement requires a rather large space. Further, such an arrangement is susceptible to electrical noise introduced by the necessarily long lead lengths between the electronics and the optical device. The electrical noise factor becomes a significant concern at bit rates exceeding approximately 10 Mb/s. Also, long leads may limit the maximum bit rate of either a transmitter or receiver, due to parasitic lead inductance (limits transmitter) or parasitic capacitances (limits receiver).

These and other concerns have led to the development of package designs which provide for the electronics and optical device to be housed in the same unit. Many of these unitary packages are relatively expensive, as a result of using a hybrid integrated circuit (HIC) arrangement for the electronics, with an optical subassembly attached to the HIC. Additionally, the piece parts used in the optical subassembly associated with these packages are often formed of machined metallic components, adding to the cost of the system. Further, these optical subassemblies have been known to experience alignment difficulties. Fabrication problems may also exist with respect to mating the various piece parts (i.e., outer housing, optical subassembly and HIC). Lastly, in many instances, the packaging processes for a transmitter and receiver are often very distinct, leading to manufacturing problems and increasing the overall expense of the packages system.

An improved package design is disclosed in U.S. Pat. No. 4,911,519 issued to W. H. Burton et al. on Mar. 27, 1990. In the disclosed arrangement, the HIC of a conventional package is replaced by a conventional 16-pin dual-in-line package (DIP) which includes a specialized pair of end prong leads for attachment to the optical subassembly. The DIP and optical subassembly are subsequently assembled within a plastic molded package frame. The plastic molded frame is configured to include a molded optical connector receptacle for subsequent attachment of a connectorized optical fiber. The arrangement is subsequently covered with a metallic lid which is grounded to the package floor. A significant savings is realized by the utilization of the DIP, as well as the molded plastic piece part of the frame/connector assembly.

Although the Burton et al. arrangement is considered to be a significant advance over the prior art, the need remains to further simplify optical packaging techniques, with respect to limiting the number of separate assembly operations, in light of rapidly growing markets which will require many thousands of such devices in as a cost-competitive arrangement as possible.

SUMMARY OF THE INVENTION

The need remaining in the prior art is addressed by the present invention which relates to optical packaging and, more particularly, to a molded optical packaging arrangement.

In accordance with an exemplary embodiment of the present invention, a leadframe section is utilized for the placement and attachment of the electrical circuitry required to operate the associated optical device (e.g., a driver circuit for a transmitter and/or an amplifier and decision circuit for a receiver). A first molding operation is then performed to encapsulate the electronics. A support member is also molded during this step, where the support member is used for the later placement of the base member of an optical subassembly. Subsequent to the first molding operation, an optical device and associated base member are positioned with and attached to the encapsulated electronics. The combination of the electronics and optics is then encapsulated during a second molding operation to form the final packaged arrangement.

In an alternative embodiment of the present invention, improved EMI shielding may be provided by utilizing a metallic plate which is disposed over and electrically coupled to the encapsulated electronics. The shield plate is attached to the arrangement prior to the final encapsulation step.

An exemplary arrangement of the present invention may utilize an optical device (and lensing element(s), if required) inserted within a conventional optical subassembly (OSA), where the electrical leads exiting the optical device are connected to the leadframe and the base member portion of the OSA rests upon the molded support member. The base member, which houses a lensing element (for example, a spherical lens, fiber stub, or any other arrangement suitable for providing optical coupling), may be formed to include a receptacle portion required for the physical attachment of a connectorized fiber to the package. Alternatively, the final molding for encapsulating the optics and electronics may be designed to provide the connector receptacle as a part of the final molded outer package.

In an alternative arrangement, the optical device (for example, a lensed LED) may be physically attached to the leadframe. In particular, the leadframe may be configured to comprise a paddle-like lead for attachment thereto of a first major surface of the optical device. The paddle includes an aperture aligned with the active region of the optical device so as to allow for the passage of the optical signal through the leadframe. A second lead is used to provide the remaining electrical attachment to the opposing major surface of the optical device. For this arrangement, a base member, positioned in the support member, includes a lensing element to facilitate coupling of the optical signal between the optical device and an attached fiber. The base member may be configured to include a connector receptacle. Alternatively, the final outer package may be molded to include the required receptacle.

An advantage of the present technique is that the combination of leadframe-based assemblies and molded packaging is not dependent upon the properties of the arrangement. That is, the present techniques are equally applicable to forming optical transmitters, receivers and/or transceivers, which are utilized in applications ranging from optical data links to fiber-to-the-home products to FDDI-compatible arrangements. Additionally, the package may be arranged to include leads which exit through the floor of the package (for later insertion through a printed circuit board, for example) or exit through the sidewalls of the package (for surface mounting or circuit board insertion, for example). The location of the connector receptacle (e.g., sidewall vs. top surface) is also considered to be discretionary.

Other and further advantages of the present invention will become apparent during the course of the following discussion and by reference to the accompanying drawings.

BRIEF DESCRIPTION OF THE DRAWING

Referring now to the drawings, where like numerals represent like parts in several views.

DETAILED DESCRIPTION

Figure 1:
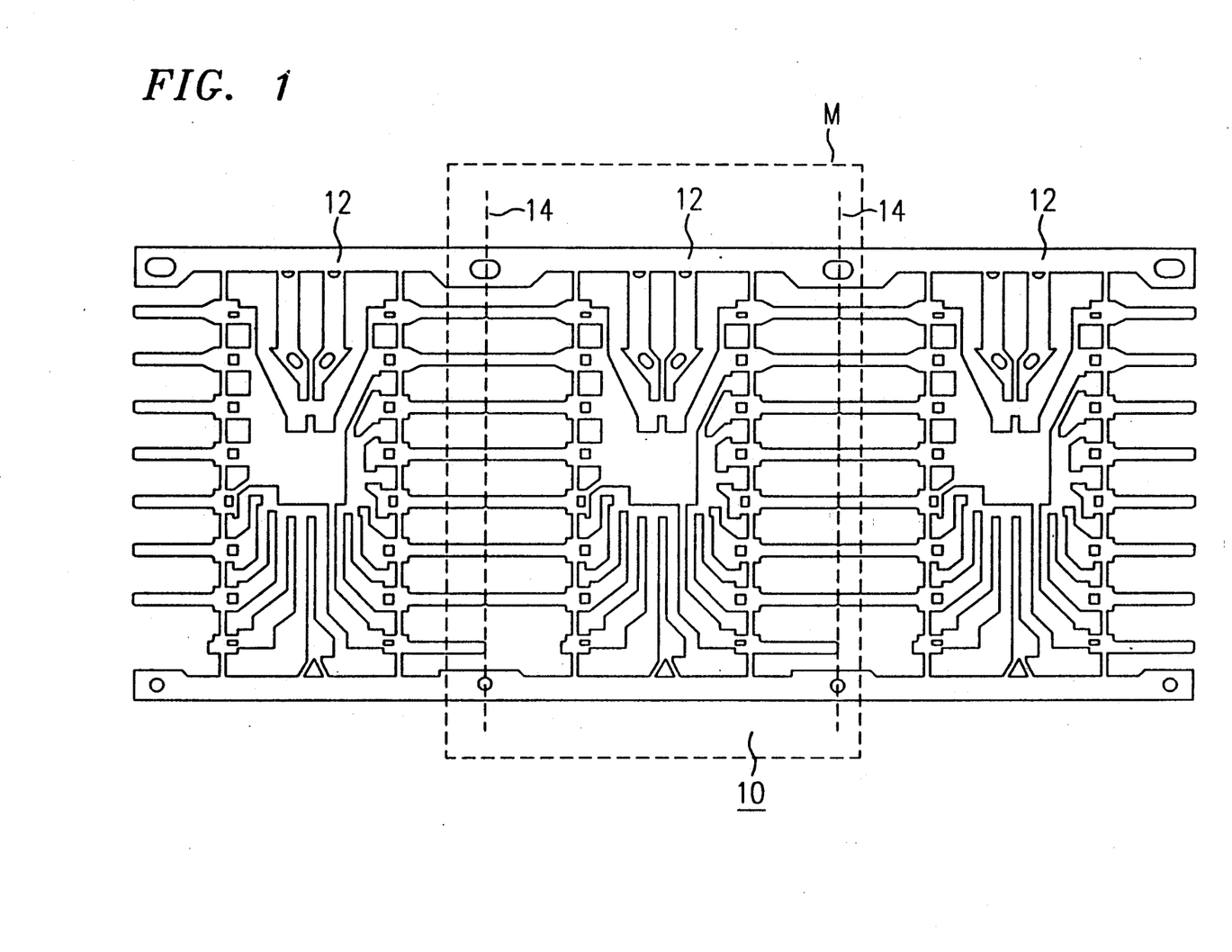
FIG. 1 illustrates an exemplary leadframe arrangement suitable for use in association with the teachings of the present invention.

Referring to FIG. 1, an exemplary leadframe 10 is illustrated which includes a large number of severable leadframe sections for use with a number of separate opto-electronic packages. It is an advantage of the present invention that the use of a leadframe structure allows for the simultaneous fabrication of a large number of opto-electronic packages, such as transmitters, receivers and/or transceivers. Similar to conventional electronic integrated circuit processing, a plurality of integrated circuits may be simultaneously attached and wirebonded along locations 12 of leadframe 10. In accordance with the teachings of the present invention, the plurality of integrated circuits are simultaneously encapsulated, leaving exposed the leads required for subsequent attachments thereto. In particular, an associated plurality of optical arrangements are subsequently attached to the molded electronics and the combination of electronics and optics encapsulated to formed the final package assembly. When the final molding operation is completed, leadframe 10 may be severed along dotted lines 14 to form a plurality of final package assemblies. The remaining figures illustrate a single leadframe section and the various items associated therewith. It is to be understood that the illustration of a single leadframe section is only for the sake of discussion and in general a larger number of opto-electronic assemblies are simultaneously formed in production.

Figure 2:
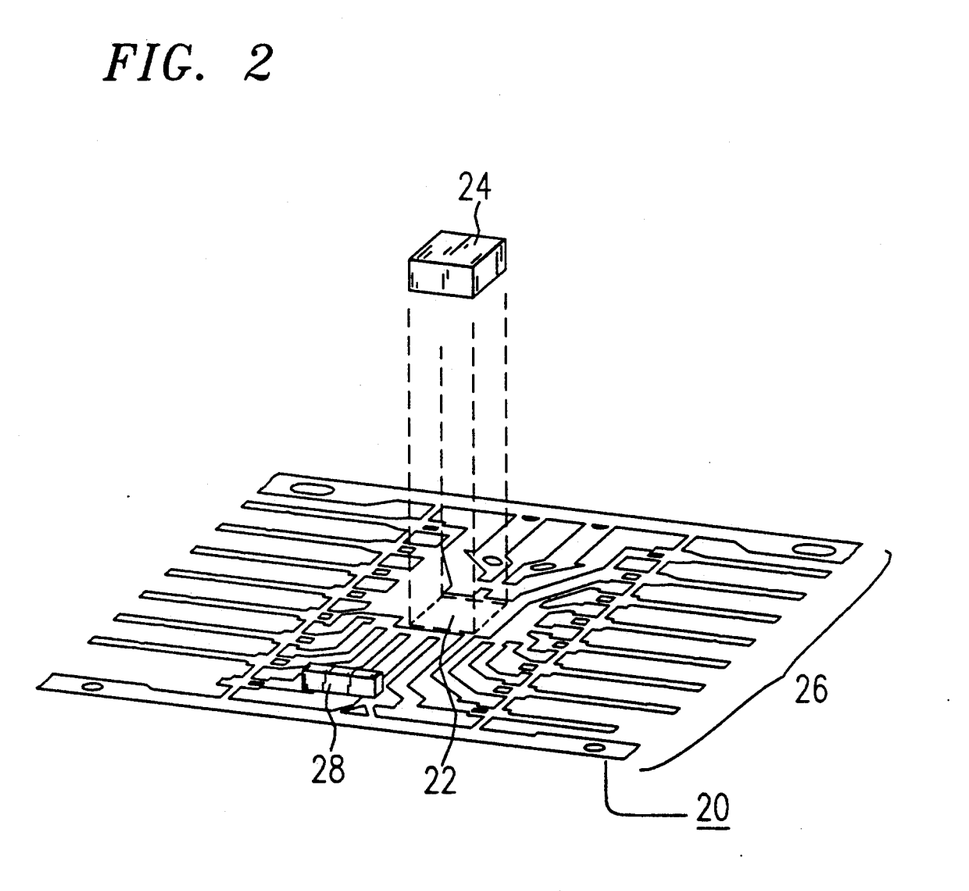
FIG. 2 illustrates a portion of the leadframe of FIG. 1 illustrating the attachment thereto of the electronics associated with a particular embodiment of the present invention.
Figure 3:
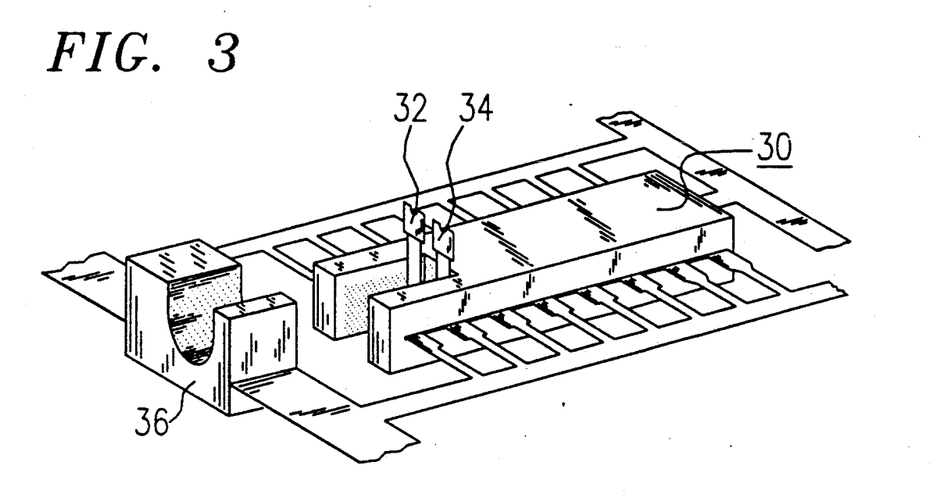
FIG. 3 illustrates the arrangement of FIG. 2 subsequent to the first encapsulation, including the formation of the support member.

A single leadframe section 20 is particularly illustrated in FIG. 2. Section 20 includes a central ground plane paddle 22 to which an integrated circuit 24 is attached. Integrated circuit 24 is subsequently coupled, using wirebonds for example, to selected leads 26 of leadframe section 20. A separate capacitive element 28, which may be required for certain transmitter and/or receiver configurations, is attached to leadframe section 20 as shown in FIG. 2. Subsequent to the attachment of electronics 24,28, a molding operation is performed to encapsulate the electronics in a first housing 30, as illustrated in FIG. 3. In this particular embodiment, used for the attachment of an optical subassembly to housing 30, a pair of end prong leads 32,34 of leadframe section 20 remain exposed. End prong leads 32,34 may be bent upwards at an angle of, for example, 90° (as shown) to facilitate the later attachment of a pair of OSA leads. Alternatively, end prong leads 32,34 may remain in the plane of leadframe section 20 and the OSA leads bent downward to complete the attachment. As shown in FIG. 3, the first molding operation is also used to form a support member 36, where as discussed above, the base portion of an OSA is positioned to rest upon support member 36. Support member 36 has been found to improve the stability of the assembly during the subsequent molding operation.

Figure 4:
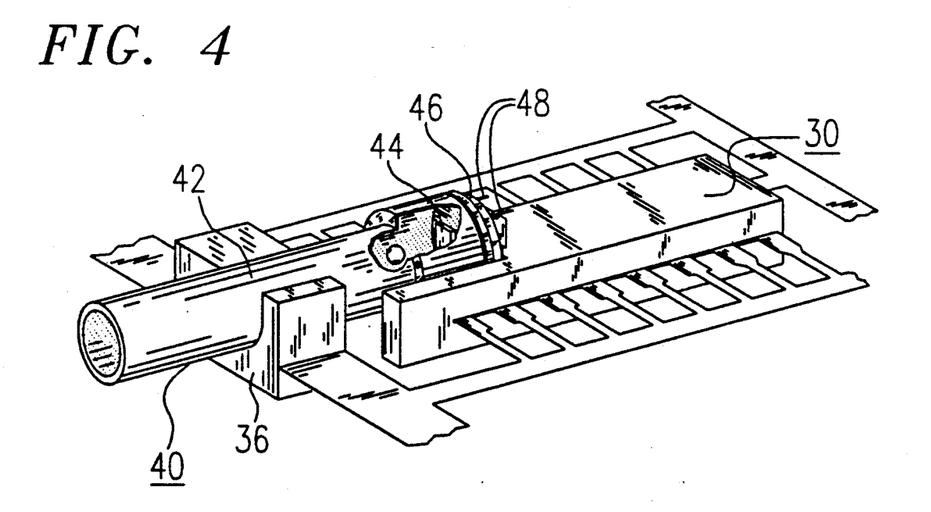
FIG. 4 illustrates the arrangement of FIG. 3 subsequent to the attachment thereto of an optical subassembly.
Figure 5:
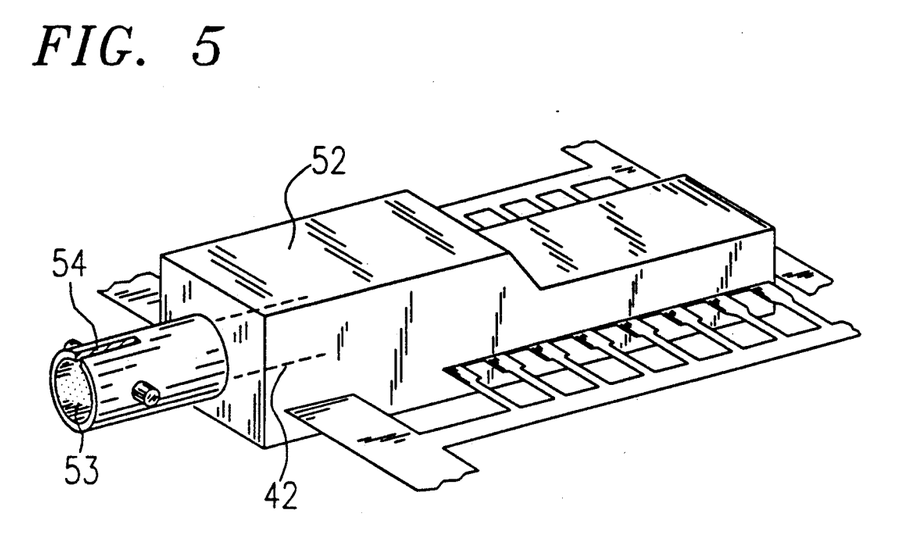
FIG. 5 illustrates the arrangement of FIG. 4 subsequent to the final encapsulation, where the connector receptacle is molded as part of the final outer package.

Referring to FIG. 4, an optical subassembly 40 is illustrated as attached to the arrangement of FIG. 3, with base member 42 of optical subassembly 40 positioned to rest upon support member 36. An optical device 44 is supported on a mount 46 such that electrical leads 48 of mount 46 may be coupled to end prong leads 32,34 (FIG. 3). Base member 42 may be attached to support member 36 using an adhesive, such as an epoxy, or merely held in place with a mandrel. The mandrel is utilized to prevent motion of OSA 40 and block the entry of any molding material into base member 42 during the final molding operation. FIG. 5 illustrates a final package of the arrangement of FIG. 4. As shown, OSA 40 and encapsulated electronic housing 30 are completely covered with a molded outer housing 52. For the particular embodiment of FIG. 5, base member 42 (partially shown in phantom) is completely embedded within housing 52 and housing 52 is formed to include a connector receptacle 54 aligned with base member 42.

As mentioned above, an exemplary molding technique which may be used to form both electronic inner package 30 and the final outer package 52 is transfer molding, as used in conventional integrated circuit packaging. In transfer molding, a preheated charge of thermoset molding compound is moved from a dielectric preheater into the mold cavity through a single inlet port. Transfer molding, as is well-known, is best suited for the type of insert molding where it is desired to precisely form certain features, such as the connector receptacle of this particular embodiment of the present invention. During the molding process, leadframe 20 of FIG. 2 (i.e., leads 26) is clamped in place to hold the components as stationary as possible. A first, relatively simple, rectangular mold is then used to encapsulate the electronics. For the second molding operation, leadframe 20 is again clamped into place and, as mentioned above, a mandrel may be used to both prevent motion of OSA 40 and create inner bore 53 of receptacle 54. For the second operation, a mold including the design of connector receptacle 54 is used to encapsulate both the housed electronics and the optical components.

Figure 6:
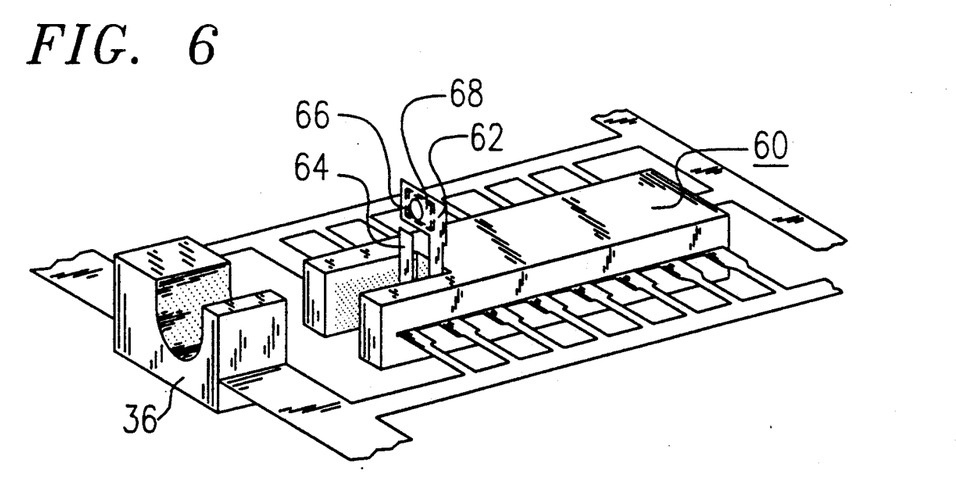
FIG. 6 illustrates an alternative arrangement of the present invention subsequent to the first encapsulation step.

In an alternative embodiment of the present invention, the use of a separate optical subassembly may be replaced by the direct attachment of an optical device to the leadframe associated with the electronics. FIG. 6 illustrates an exemplary encapsulated electronic subassembly 60 including a specialized pair of leads 62,64 for the direct attachment thereto of an optical device. As shown, lead 62 is formed to comprise a paddle-like shape and may include an aperture 66. An optical device 68 (shown in phantom) is attached along a first major surface to paddle 62 such that the active region of device 68 is aligned with aperture 66. Alternatively, device 68 may be attached to the opposite side of paddle 62 such that an aperture is not required. The remaining electrical contact to device 68 is formed by wirebonding the opposing major surface of device 68 to lead 64.

Figure 7:
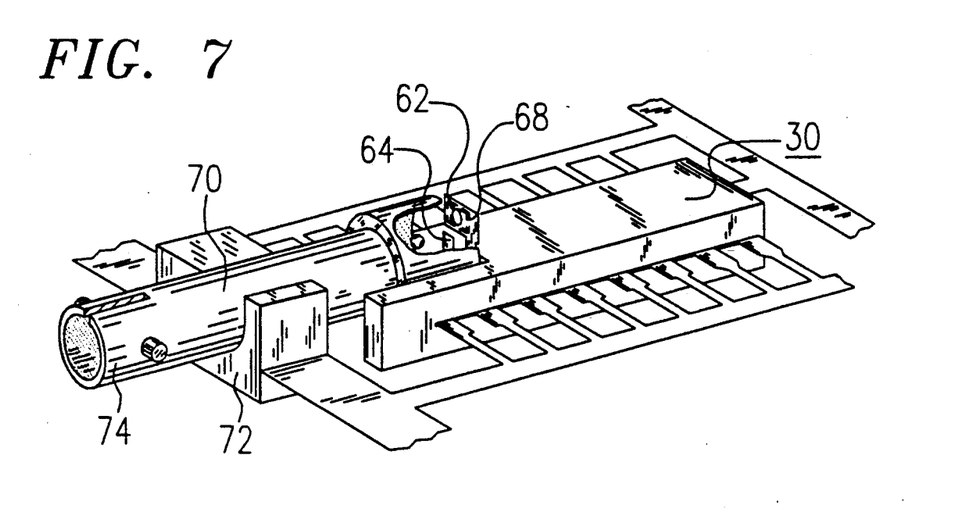
FIG. 7 illustrates the arrangement of FIG. 6 subsequent to the attachment thereto of an optical device and associated base member, the base member configured to include a connector receptacle.

As with the arrangement described above in association with FIGS. 1-5, the arrangement of FIG. 6 may require the utilization of an optical base member to facilitate the optical coupling between device 68 and an connected optical fiber. FIG. 7 illustrates an exemplary embodiment wherein a base member 70 is positioned upon a support member 72 and attached to paddle 62 so as to be in optical alignment with device 68. In general, base member 70 may include a lensing element (e.g., spherical lens or fiber stub) to improve optical coupling.

Figure 8:
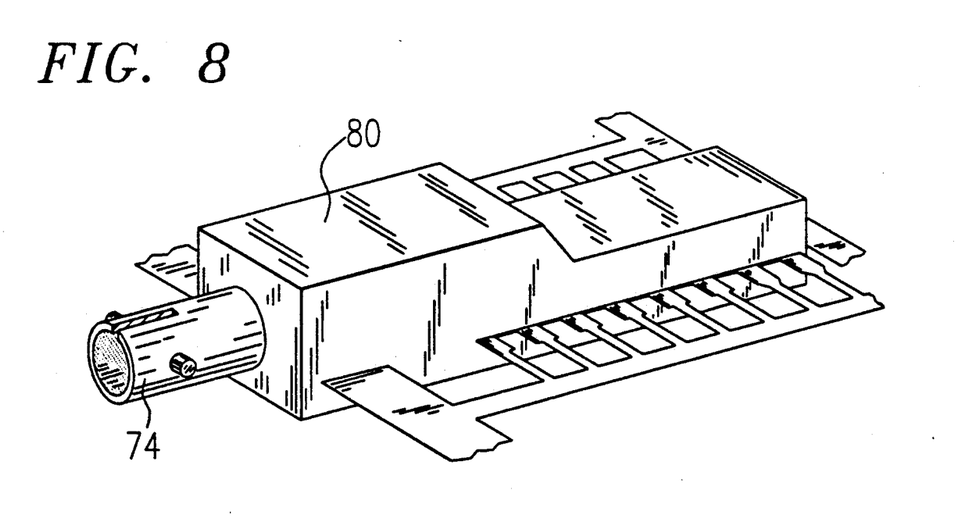
FIG. 8 illustrates the arrangement of FIG. 7 subsequent to the final molding, where the receptacle portion of the base member remains exposed beyond the outer package housing.

For the particular embodiment illustrated in FIG. 7, base member 70 is formed to include a connector receptacle 74. The use of a base member including a receptacle portion thus simplifies the final molding operation (i.e., no need to mold a receptacle) and ensures that the receptacle will be optically aligned with the associated optical device. FIG. 8 illustrates the arrangement of FIG. 7 subsequent to the final molding operation. As shown, the mold used for this process is configured to form an outer housing 80 such that receptacle portion 74 of base member 70 remains exposed.

Figure 9:
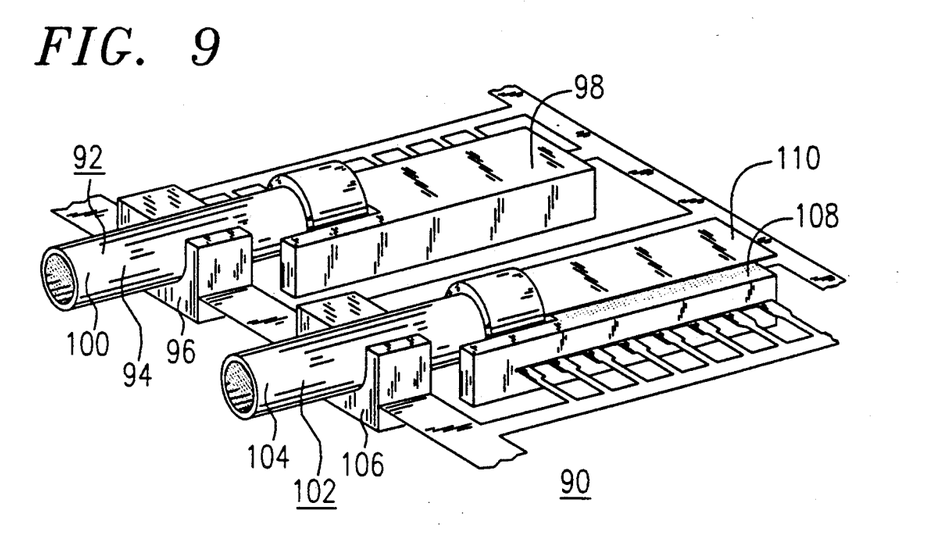
FIG. 9 illustrates an alternative embodiment of the present invention, prior to the final encapsulation, particularly suited for the combined packaging of a pair of optical devices such as in the formation of a molded transceiver package, where in this embodiment the optical subassemblies are formed to include a pair of connector receptacles.

An advantage of the leadframe-based packaging technology of the present invention is that any number of optical devices (and the associated encapsulated electronics) may be embedded within the same molded outer package. In general, therefore, an array-like package may be formed. In one particular embodiment, a pair of optical devices may be simultaneously encapsulated so as to form, for example, a dual-wavelength transmitter or receiver (or a sparing arrangement) or, alternatively, a transceiver including a light transmitting device (e.g., LED or laser) and a light receiving device (e.g., PIN or avalanche photodiode). FIG. 9 illustrates in particular an exemplary transceiver package 90 formed in accordance with the teachings of the present invention. As shown in this view, a first OSA 92 (housing a light transmitting device and any required lensing elements) includes a base member 94 which rests upon a first support member 96. OSA 92 is also electronically coupled to encapsulated driver electronics 98. Base member 94 of OSA 92 is formed in this particular configuration to include a connector receptacle 100. Similarly, a second OSA 102 (housing a light receiving device and any required lensing elements) includes a base member 104 which rests upon a second support member 106. OSA 102 is then electrically coupled to encapsulated amplifier-decision circuit electronics 108. In order to reduce the effects of electromagnetic interference (EMI) on the operation of electronics 108, a metallic plate 110 may be disposed over package 108 and coupled to the ground plane exiting package 108 to form an EMI shield. Plate 110 may comprise a separate piece of metal which is attached to the leadframe subsequent to the first molding operation (i.e., encapsulation of the electronics). Alternatively, the leadframe utilized for this embodiment may be formed to include a plate portion which may be bent over the packaged electronics to form the shield.

Figure 10:
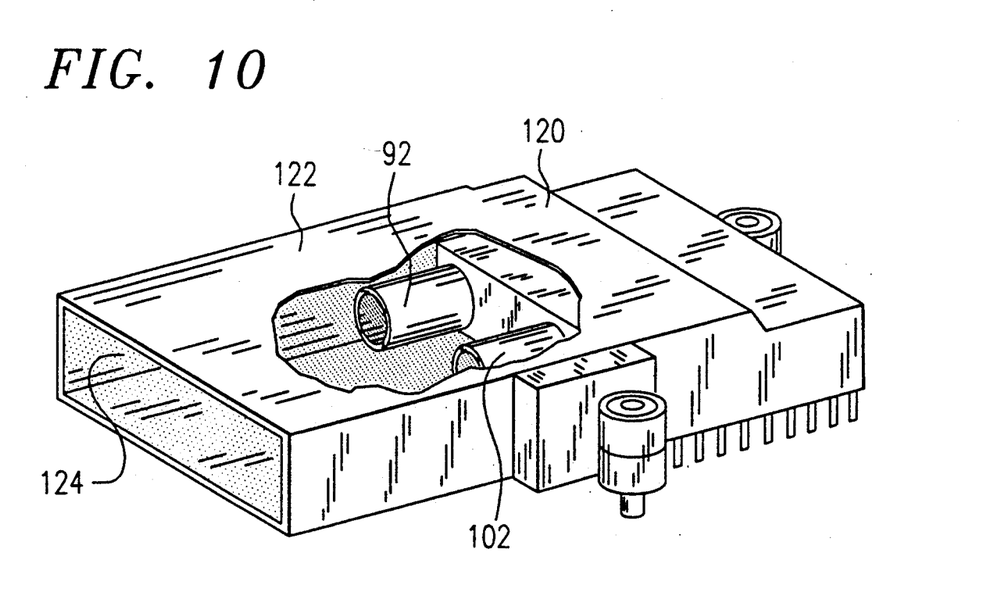
FIG. 10 illustrates an encapsulated view of the arrangement of FIG. 9, particularly illustrating an alternative connector receptacle design.

FIG. 10 illustrates an encapsulated view of the arrangement of FIG. 9, where the outer package 120 is molded to completely cover first OSA 92, first electronics 98, second OSA 102 and second electronics 108. In this particular embodiment, package 120 includes a connector receptacle 122 of the design as shown in FIG. 10. In particular, connector receptacle 122 comprises an opening 124 of sufficient depth that first and second OSAs 92 and 102 remain exposed. For one exemplary embodiment of this arrangement, the molding operation used to form outer package 120 may simultaneously from connector receptacle 122. Alternatively, connector receptacle 122 may comprises a piece part separate from outer package 120 which is subsequently clamped over package 120 to form the arrangement as illustrated in FIG. 10.

We claim:

1. An optical communication arrangement comprising:

a leadframe section;

optical means, including an active semiconductor optical device and a base member, said base member for facilitating coupling between said optical device and an optical fiber;

electronic circuitry for the operation of said active optical device, attached to said leadframe section;

first molded packaging disposed to encapsulate said electronic circuitry and further comprising a molded support member, the optical means base member disposed to rest upon said molded support member and the active optical device coupled to the encapsulated electronic circuitry; and second molded packaging disposed to cover both the encapsulated electronic circuitry and the optical means attached thereto.

2. An optical communication arrangement as defined in claim 1 wherein the arrangement further comprises connector receptacle means for facilitating attachment of an optical fiber to said arrangement.

3. An optical communication arrangement as defined in claim 2 wherein the outer molded packaging is formed to include the connector receptacle means and the base member of the optical means remains essentially embedded with said second molded packaging.

4. An optical communication arrangement as defined in claim 2 wherein the optical means base member is formed to include the connector receptacle and the second molded packaging is formed such that the connector receptacle portion of said base member remains exposed.

5. An optical communication arrangement as defined in claim 1 wherein the active optical device is directly attached and electrically coupled to the leadframe section.

6. An optical communication arrangement as defined in claim 1 wherein the optical means comprises an optical subassembly including a mounting member for supporting said active optical device, said base member aligned with said mounting member.

7. An optical communication arrangement as defined in claim 1 wherein the active optical device comprises an optical transmitting device.

8. An optical communication arrangement as defined in claim 1 wherein the active optical device comprises an optical receiving device.

9. An optical communication arrangement as defined in claim 1 wherein the arrangement further comprises EMI shielding means disposed over the first molded packaging and electrically coupled to the leadframe section.

10. An optical communication arrangement as defined in claim 1 wherein the first and second molded packaging comprise a plastic material.

11. An optical communication arrangement as defined in claim 10 wherein the plastic material comprises a transfer-molded plastic.

12. An optical communication arrangement for use with a pair of active optical devices, the arrangement comprising
a leadframe section;
first electronic circuitry for the operation of a first optical device, attached to said leadframe section;
second electronic circuitry for the operation of a second optical device, attached to said leadframe section in a location physically separate from said first electronic circuitry;
first molded packaging for encapsulating said first electronic circuitry and including a first molded support member;
second molded packaging for encapsulating said second electronic circuitry and including a second molded support member;
first optical means, including an active semiconductor optical device, coupled to said first encapsulated electronic circuitry, said first optical means further including a first base member disposed to rest upon the first molded support member;
second optical means, including an active semiconductor optical device, coupled to said second encapsulated electronic circuitry, said second optical means further including a second base member disposed to rest upon the second molded support member; and
third molded packaging disposed to cover the first and second molded packaging and the first and second optical means.

13. An optical communication arrangement as defined in claim 12 wherein the arrangement further comprises
first connector receptacle means for facilitating attachment of a first optical fiber to said arrangement; and
second connector receptacle means for facilitating attachment of a second optical fiber to said arrangement.

14. An optical communication arrangement as defined in claim 13 wherein the third molded packaging is formed to include the first and second connector receptacle means.

15. An optical communication arrangement as defined in claim 13 wherein
the first optical means base member is formed to include the first connector receptacle means; and
the second optical means base member is formed to include the second connector receptacle means, wherein the third molded packaging is formed such that the connector receptacle portions of the first and second base members remain exposed.

16. An optical communication arrangement as defined in claim 12 wherein the first and second optical means each include an optical transmitting device.

17. An optical communication arrangement as defined in claim 12 wherein the first and second optical means each include an optical receiving device.

18. An optical communication arrangement as defined in claim 12 wherein the first optical means includes an optical transmitting device and the second optical means includes an optical receiving device.

19. An optical communication arrangement as defined in claim 18 wherein the arrangement further comprises EMI shielding means disposed over the second molded packaging.

20. An optical communication arrangement as defined in claim 12 wherein the first, second and third molded packaging comprise a plastic material.

21. An optical communication arrangement as defined in claim 20 wherein the plastic material comprises a transfer-molded plastic.

22. A method for packaging an optical communication arrangement, the method comprising the steps of:
a) providing a leadframe section;
b) attaching to said leadframe section electronic circuitry for the operation of an optical device;

c) molding a first package to encapsulate the electronic circuitry and form an optical support member adjacent thereto;

d) positioning an active semiconductor optical device upon said optical support member;

e) electrically attaching said active semiconductor optical device to said leadframe;

f) molding a second package to encapsulate both the packaged electronic circuitry and said optical device.

23. The method according to claim 22 wherein the method further comprises the step of:

g) providing a connector receptacle which extends beyond the second package molded in step f), said connector receptacle for providing physical attachment of a fiber connector to said arrangement.

24. The method according to claim 23 wherein step f) and g) are performed simultaneously such that the second package is molded to include a connector receptacle.

25. The method according to claim 23 wherein step g) is performed prior to step f) such that the second package is molded to allow for the connector receptacle to remain exposed.

26. The method according to claim 22 wherein in performing steps c) and f), transfer molding is utilized.

* * * * *